(12) United States Patent
Chan

(10) Patent No.: US 10,672,592 B2
(45) Date of Patent: Jun. 2, 2020

(54) NON-THERMAL SOFT PLASMA CLEANING

(71) Applicant: Chia Sern Chan, Singapore (SG)

(72) Inventor: Chia Sern Chan, Singapore (SG)

( * ) Notice: Subject to any disclaimer, the term of this patent is extended or adjusted under 35 U.S.C. 154(b) by 185 days.

(21) Appl. No.: 15/545,265

(22) PCT Filed: Jan. 22, 2016

(86) PCT No.: PCT/SG2016/050029
§ 371 (c)(1),
(2) Date: Jul. 20, 2017

(87) PCT Pub. No.: WO2016/118088
PCT Pub. Date: Jul. 28, 2016

(65) Prior Publication Data
US 2018/0019106 A1    Jan. 18, 2018

(30) Foreign Application Priority Data
Jan. 22, 2015  (SG) .......................... 10201500483V

(51) Int. Cl.
*H01J 37/32*      (2006.01)
*B08B 7/00*       (2006.01)
*H01L 21/67*      (2006.01)

(52) U.S. Cl.
CPC ...... *H01J 37/32623* (2013.01); *B08B 7/0035* (2013.01); *H01J 37/32* (2013.01); *H01J 37/32532* (2013.01); *H01J 37/32541* (2013.01); *H01J 37/32577* (2013.01); *H01J 37/32825* (2013.01); *H01L 21/67017* (2013.01); *H01J 37/3244* (2013.01); *H01J 2237/335* (2013.01); *H05H 2245/121* (2013.01)

(58) Field of Classification Search
CPC ................. H01J 37/32; H01J 37/32623; H01J 37/32825; H01J 37/32577; H01J 37/32532; H01J 37/32541; H01J 37/3244; H01J 2237/335; H01L 21/67017; B08B 7/0035; H05H 2245/121
See application file for complete search history.

(56) References Cited

U.S. PATENT DOCUMENTS 5,938,854 A    8/1999   Roth et al.
5,997,705 A    12/1999  Welty
(Continued)

FOREIGN PATENT DOCUMENTS

JP            H06-42462 B2    1/1994

*Primary Examiner* — Benjamin L Osterhout

(57) ABSTRACT

The present invention provides a Soft Plasma Cleaning (SPC) system (30, 130, 230) including a Guided Soft-Plasma Cleaning (G-SPC) (30). The SPC system is a non-thermal, low temperature process and operable at atmosphere pressure, in both air and liquid medium. In an embodiment, a feedstock gas (40) is supplied to provide a discharging fluid (50) in the cleaning chamber (34). A plasma guiding and amplifying component (52) guides and expands the discharging fluid to cover a large ablation area over the workpiece (32), thereby also suppressing ion and electron bombardment damage or etching. The plasma guiding and amplifying component (52) may be formed with dielectric plates or tubes (37, 56, 58), with each dielectric having an aperture (37a, 56a, 58a). The electric field and ion energy in the cleaning chamber can be additionally controlled via a floating electrode (160, 160a), so as to suppress plasma damage during SPC.

19 Claims, 15 Drawing Sheets

(56) References Cited

U.S. PATENT DOCUMENTS

| | | |
|---|---|---|
| 6,118,218 A | 9/2000 | Tializis et al. |
| 6,329,297 B1 | 12/2001 | Balish et al. |
| 6,379,575 B1* | 4/2002 | Yin ................. B08B 7/0035 134/1.1 |
| 6,835,678 B2 | 12/2004 | Selbrede et al. |
| 6,906,280 B2 | 6/2005 | Rosocha |
| 6,972,071 B1* | 12/2005 | Tyler ............. H01J 37/32357 118/715 |
| 7,754,994 B2 | 7/2010 | Yan et al. |
| 8,100,081 B1 | 1/2012 | Henri et al. |
| 8,471,171 B2 | 6/2013 | Price et al. |
| 2002/0002982 A1* | 1/2002 | Fornsel ............ B08B 7/0035 134/1.1 |
| 2002/0136674 A1* | 9/2002 | Vane ................ B08B 7/0035 422/186.07 |
| 2003/0029475 A1* | 2/2003 | Hua ................. B08B 7/0035 134/1.1 |
| 2003/0183244 A1* | 10/2003 | Rossman ........... B08B 7/0035 134/1.1 |
| 2004/0000321 A1* | 1/2004 | Cui ................. C23C 16/4405 134/1.2 |
| 2004/0168769 A1* | 9/2004 | Matsuoka ......... C23C 16/4404 156/345.33 |
| 2004/0222745 A1* | 11/2004 | Chistyakov ......... C23C 14/34 315/111.41 |
| 2005/0133484 A1 | 6/2005 | Delzenne |
| 2007/0170155 A1 | 7/2007 | Fink et al. |
| 2008/0197168 A1* | 8/2008 | Horino .............. B08B 7/0035 228/8 |
| 2011/0000432 A1* | 1/2011 | Chen ................ B08B 7/0035 118/723 E |
| 2011/0020189 A1* | 1/2011 | Yan ................. B08B 7/0035 422/186.03 |
| 2013/0084409 A1 | 4/2013 | Vangeneugden |
| 2013/0306101 A1 | 11/2013 | Swanson et al. |
| 2014/0076716 A1* | 3/2014 | Gorokhovsky ... H01J 37/32357 204/192.12 |
| 2015/0140827 A1* | 5/2015 | Kao ................. H01L 21/31116 438/704 |

\* cited by examiner

| Row | COMPARISON OF SPC WITH OTHER PLASMA TECHNIQUES | | | | | |
|---|---|---|---|---|---|---|
| 1 | Process Parameters | Capacitively/ Inductively Coupled Plasma (CCP/ICP) | Plasma Cutting | Direct Dielectric Electric Barrier (DBD) Cleaning | Electric discharge machining (EDM) | SPC |
| 2 | Working Pressure | Low Pressure | Atmospheric | Atmospheric | Atmospheric | Atmospheric |
| 3 | Feedstock | Gas | Gas | Gas | Non-conductive liquid (e.g. water) | Fluids |
| 4 | Power Consumption | Medium | Very High | Low | High | Low |
| 5 | Speed | Low | Very High | Medium | Low | High |
| 6 | Removable Contaminant | Organic Compounds, Oxide and the like. | Almost All | Organic compounds only | Metals only | Almost All |
| 7 | Temperature | Medium (200-800° C) | Very High (20000-30000° C) | Low (<100° C) | High (7000-10000° C) | Low (< 65° C) |
| 8 | Damage | High | Very High | Low | Medium | Low |

FIG. 2

| TEST PARAMETERS OF G-SPC ||
|---|---|
| PROCESS PARAMETER ||
| Feedstock gas | Argon |
| Pressure | 1 bar |
| Power Supply | AC driven (up to 500W) |
| Frequency | 5-25 kHz |
| Process Time | <60s or longer |
| Gap between Electrode to Work piece | 15-25 mm |

| Material | Linear coefficient at 20 °C ($10^{-6}$ $K^{-1}$) | Volumetric coefficient at 20 °C ($10^{-6}$ $K^{-1}$) |
|---|---|---|
| Aluminium | 23.1 | 69 |
| Copper | 17 | 51 |
| Diamond | 1 | 3 |
| Gold | 14 | 42 |
| Iron | 11.8 | 33.3 |
| Lead | 29 | 87 |
| Magnesium | 26 | 78 |
| Mercury | 61 | 182 |
| Molybdenum | 4.8 | 14.4 |
| Nickel | 13 | 39 |
| Platinum | 9 | 27 |
| Silicon | 2.56 | 9 |
| Silver | 18 | 54 |
| Titanium | 8.6 | 11–14 |
| Tungsten | 4.5 | 13.5 |

NON-THERMAL SOFT PLASMA CLEANING

FIELD OF INVENTION

The present invention relates to non-thermal, atmospheric pressure soft plasma cleaning in both air and liquid mediums.

BACKGROUND

Known methods for surface cleaning of physical objects include wet cleaning (such as, brushing with detergent and water and drying, and ultrasonic solvent cleaning) and dry cleaning (such as, laser ablation, carbon dioxide composite cleaning, and plasma cleaning). Plasma cleaning has the advantages of being a fast one-stop dry process, with compatibility or both offline and in-line cleaning.

Conventional plasma cleaning however induces damage to workpieces; this a concern particularly when the object for cleaning is sensitive to damage such as semiconductor wafers, integrated circuit components and living tissues. The damage on such sensitive objects arises due to bombardment of ions and electrons in the plasma and undesirable etching on the surface of the objects. Undesirably, the temperature of the plasma cleaning process is also high, typically being over 100 degC. thus making cleaning of plastic objects impossible due to their low melting temperatures. When a vacuum chamber is involved, it adds to the cost of a large machine footprint and capital expense. In addition, the feedstocks often required for plasma cleaning are toxic and/or flammable. Atmospheric pressure chambers are known in the art but low temperature, high plasma cleaning rates and large area plasma cleaning are desirable features for commercial applications. Obtaining all these desirable features in the same apparatus have remained a challenge.

U.S. Pat. No. 7,754,994 discloses a method for generating atmospheric gas discharge plasma in a gas whirlpool cavity. The plasma is then sprayed out in a gas flow to clean objects one after another in a continuous manner. The process is cheap and simple. U.S. Pat. No. 8,471,171 discloses a micro-hollow cathode discharge assembly that is capable of generating a low temperature and atmospheric pressure plasma micro jet that enables the application of the assembly to low temperature treatments including treatment of living tissues. U.S. Pat. No. 6,906,280 discloses fast pulse non-thermal plasma reactor where the pulses create non-thermal plasma discharge within a discharge cell. Accordingly, the non-thermal plasma discharge can be used to remove pollutants from gases or break the gases into smaller molecules so that they can be more efficiently combusted. U.S. Pat. No. 6,329,297 discloses dilute remote plasma cleaning process, and apparatus for enhancing its etching rate and uniformity. The plasma remotely formed is diluted before flowing into a processing chamber to clean or etch an object or the interior of the chamber itself. U.S. Pat. No. 6,835,678 discloses a system and method for remote plasma where activated species from a remote plasma generator is delivered into a processing chamber.

Though plasma cleaning is preferred over many other cleaning methods, improvements are desirable to lower the process temperature, to perform the cleaning process at atmospheric pressure, to reduce ion and electron bombardment damage, fast processing for increased throughput and large surface cleaning, and to perform the cleaning process without the use of toxic or flammable feedstock gases. Also desired is plasma cleaning in air or in a liquid medium.

SUMMARY

The present invention provides a Soft Plasma Cleaning (SPC) system in which plasma damage is suppressed. The SPC system includes a Guided SPC in which a plasma is generated and guided to sweep over the workpiece, and another SPC system with a floating electrode.

In one embodiment, the SPC comprises a cleaning chamber containing air or gas at atmospheric pressure as defined in claim 1.

Preferably, the plasma in the SPC reaches the workpiece in a sweeping direction. This is aided by a feedstock gas to provide a discharging fluid, which increases an ablation or cleaning area. Preferably, the SPC system comprises a plasma guiding and amplifying component to control the plasma properties. In another embodiment, the SPC system comprises a floating electrode disposed in the cleaning chamber; the floating electrode or floating electrodes is provided to control the electric field and ion energy to suppress plasma damage on the workpiece.

In another embodiment, the SPC comprises a cleaning chamber containing a liquid or solvent with salt ions or a chemical solution as defined in claim 13.

BRIEF DESCRIPTION OF THE DRAWINGS

This invention will be described by way of non-limiting embodiments of the present invention, with reference to the accompanying drawings, in which:

FIG. 2 provides a comparison chart for the process parameters and performance parameters for SPC under the present invention with known plasma cleaning and related machining processes;

DETAILED DESCRIPTION

Figure 1:
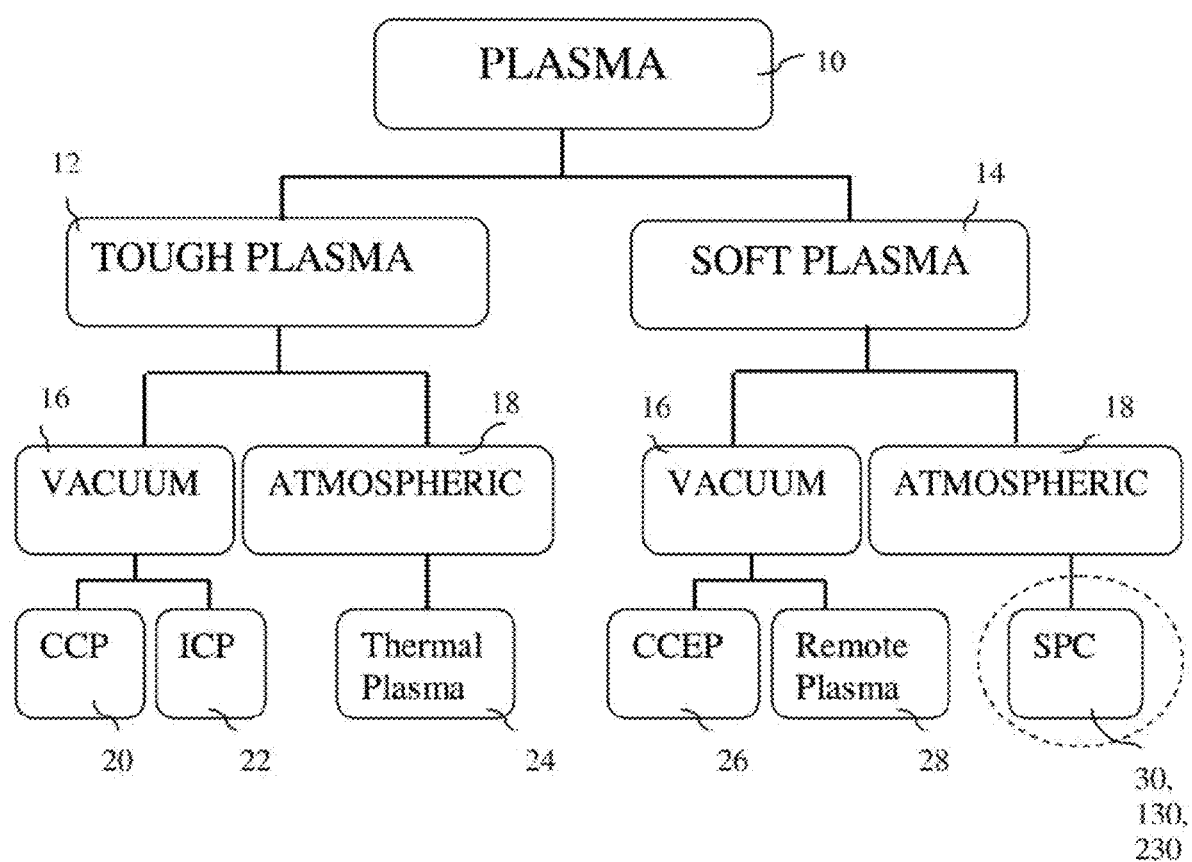
FIG. 1 is a block diagram showing the different types of common plasma cleaning processes including the process of Soft-Plasma Cleaning (SPC) and a Guided-SPC provided under the present invention.

One or more specific and alternative embodiments of the present invention will now be described with reference to the attached drawings. It shall be apparent to one skilled in the art, however, that this invention may be practised without such specific details. Some of the details may not be described at length so as not to obscure the invention. For ease of reference, common reference numerals or series of numerals will be used throughout the figures when referring to the same or similar features common to the figures.

According to the present invention, systems and methods for generating Soft Plasma Cleaning (SPC) are provided. This SPC includes Guided Soft-Plasma Cleaning (G-SPC) in an air medium and a SPC system for use in air or a liquid medium. With this SPC, the ion energies are controlled to a low level; thus, the SPC and G-SPC are non-thermal, low temperature process and operated at atmospheric pressure in air so that plasma damage on a workpiece is suppressed. No external heating module is required as the cleaning temperature is less than about 65 degC. Hence, this process is suitable for cleaning even plastics without melting them during this plasma cleaning process. Also advantageously the SPC and G-SPC are used at atmospheric pressure with no vacuum pump being employed. The SPC and G-SPC apparatus thus has a small equipment footprint and may also be made portable, for example for fitting into a cavity of a test socket in the semiconductor industry. Again advantageously, the feedstock fluids for the G-SPC are environmental friendly. When toxic, flammable or corrosive fluids or gases are used for removing specific contaminants, an isolated working environment is required. Additionally, the SPC and G-SPC are non-destructive yet very fast, dry process that is configurable for offline cleaning, in-line cleaning and remote cleaning. Another embodiment of the SPC is provided to operate in a fluid medium. The SPC of this invention is provided to remove almost all types of contaminants, including organic residues, inorganic residues (such as, metals) and dusts. Any undesirable corrosion or erosion due to chemical reactions between the reactive plasma species and the surface of workpieces are minimized by feeding in an inert feedstock gas.

In one embodiment, the G-SPC innovatively uses the feedstock gas to provide a discharging fluid in the cleaning chamber to guide the plasma, to expand the ablation area and to suppress ion and electron bombardment damage or etching. The use of a plasma alignment and amplification component for guiding, focusing and amplifying the plasma is also unique. By use of the discharging fluid guided plasma, mechanical and micro-structural damage on the surface of the work pieces caused by ions and electron bombardments is minimized. The surface damage is substantially suppressed by controlling the frequency, amplitude and direction of ions and electron bombardments onto the surfaces of the work pieces, for example, by controlling the oscillating electric field, and by manipulating the direction of the feedstock gas and the direction of the discharging fluid.

Although a 'soft', 'atmospheric-pressure' and 'low-temperature' method, the G-SPC is able to remove almost all kinds of contaminants including those that are tightly adhered to surface of the workpiece; without being limited, the cleaning mechanisms involve localized thermal expansion and high-density, oscillating ions, radicals, plasma species and fragmented clusters. For example, during the process of G-SPC, due to localized thermal expansion, the difference in thermal expansions of the contaminants and workpiece loosens the contaminants from the workpiece surface; in another example, heavy radicals in the discharging fluid derived from the feedstock gas (such as argon, krypton and xenon) or ions in the liquid medium are used to transfer oscillating energy to the contaminants; in this way, the oscillating radicals knock the contaminants away from the workpiece surface, especially in deep seated recesses on the workpiece surface. The cleaning mechanisms are controlled by the ions oscillating directions, frequency and output power of the power supply, direction of the fluids, density and mass of the plasma species and the like. In another embodiment, the feedstock gas includes reactive gas(es) for chemical reactions on the surface of the workpiece; for example, when a mixture of argon and chlorine gas is used, the chlorine radicals read with the metallic surface of the workpiece. The workpiece after plasma cleaning is thus recoverable with minimal surface damage.

The plasma is generated by a DC, AC, RF or pulsed driven power generator or power supply driven in other modes. A non-thermal plasma in the discharging fluid is generated. The plasma in the discharging fluid includes electrons, ions, radicals and neutral species from the feedstock gas, electrodes and the ambient gases.

Large clusters of materials at the electrodes in the plasma are also fragmented and atomized in high density non-equilibrium plasma by impulsive ion forces within an ultra-thin plasma sheath. The degree of fragmentation is proportional to the electric field across the ultra-thin plasma sheaf, the mass of the feedstock species, electron temperature and electron density. The degree of fragmentation is monitored via real-time in-situ measurements of the mass of the feedstock species electron temperature and election density; these measurements are then used to characterise an impulsive ion force. The electrode can be of the same materials as the work-piece to prevent secondary contamination and to recover the surface condition of the workpiece during plasma cleaning. The atomic radicals exert oscillating forces to the contaminants deposited or embedded onto the workpiece surface. Meanwhile, heat transfer process occurs between the plasma and the surface of the workpiece. Due to thermal expansion at different rates, the contaminants become loosely bonded from the surface. The oscillation forces from the atomic radicals are capable of knocking away or releasing the contaminants from the surface. In addition, replacement of the contaminants also reduces the surface roughness or distortion that is caused by removal of the embedded contaminants. Thus, electrodes which are of the same materials as the workpiece provide the sources of atomic radicals to replace the contaminants on the surface of workpiece; in addition, in-situ plasma annealing repairs the surface micro-structure of the workpiece.

The feedstock gas can be of a single element or a mixture of gases. The feedstock gas includes inert gas components that have lower ionization threshold energy, such as argon, and other noble gases. Use of the inert gases can protect the surface of the work pieces from being oxidized or nitrided due to the presence of ambient gases.

Different types of common plasma cleaning processes including the process provided under the present invention (SPC) are shown for reference in the block diagram at FIG. 1. Plasma 10 may be a tough plasma 12 or a soft plasma 14, generated within vacuum 16 or under atmospheric condition 18. For tough plasma 12, typically capacitively coupled plasma (CCP) 20 and inductively coupled plasma (ICP) 32 are under vacuum 16 and thermal plasma 24 is under atmospheric condition 18. For soft plasma 14, typically capacitively coupled electrodeless plasma (CCEP) 26 and remote plasma 28 are under vacuum 16 and SPC 30, 130, 230 provided under the present invention (as highlighted by the dashed circle) is under atmospheric condition 18.

FIG. 2 provides a chart for the process parameters and performance parameters for G-SPC under the present invention compared with other commonly used plasma cleaning processes. As can be seen from the chart, the G-SPC process is compared with CCP/ICP, Plasma Cutting, Direct Dielectric Electric Barrier (DBD) Cleaning and Electric discharge machining (EDM). The G-SPC process under the present invention has all the advantages of being operable at atmospheric pressure, at low power consumption, at low temperature and high-dealing speeds, while also being able to remove almost all types of contaminants and yet with no or low plasma (ion and electron bombardments) damage.

Figure 3:
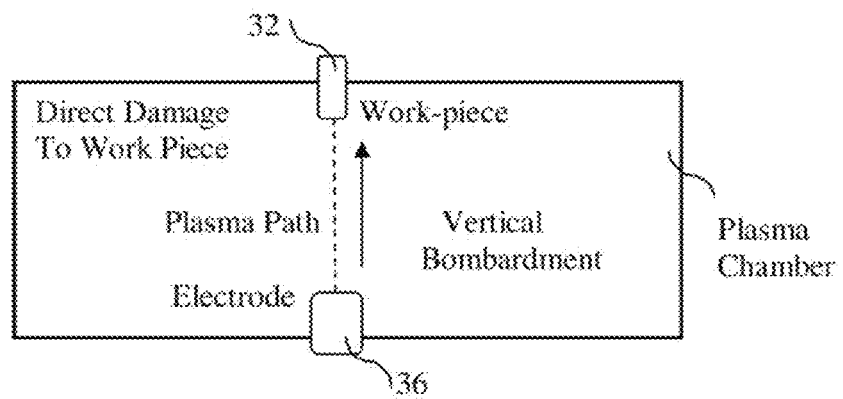
FIG. 3 is a schematic of a known non-thermal plasma (NTP) discharge system.
Figure 4A:
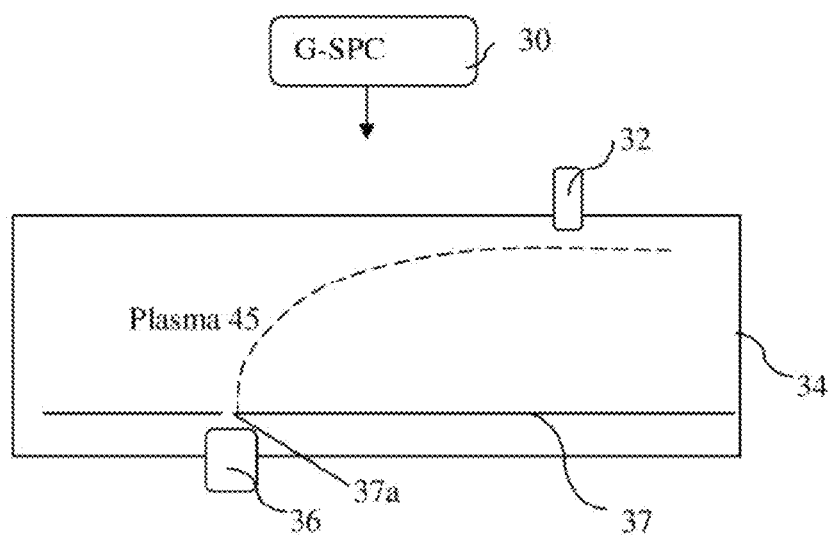
FIGS. 4A-4C are schematics of the G-SPC system according to embodiments of the present invention.
Figure 4B:
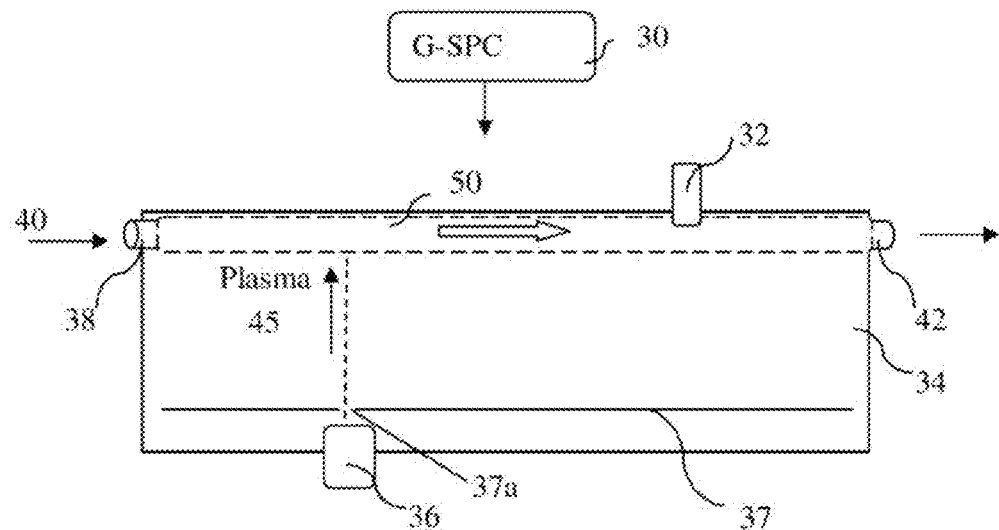

FIG. 3 shows a typical set up for a conventional nonthermal plasma (NTP) process; in this NTP, the path of plasma from the electrode 36 to the workpiece 32 is direct; this causes direct ion and electron bombardments resulting in undesirable damage to the workpiece surface. An embodiment of the set up for the G-SPC process is illustrated in FIG. 4A where the path of plasma 45 from the electrode 36 to the workpiece 32 is 'in-direct'; the substantially reduced plasma bombardment results in reduced damage to the workpiece 32. As seen in FIG. 4A, the workpiece 32 is away from the direct path of the plasma 45. FIG. 4B shows another embodiment with the addition of a feedstock gas 40 and an exhaust gas 42. In this embodiment the path of the plasma 45 as generated is vertical (as seen an FIG. 4B) whilst the flow of the feedstock gas 40 is in the horizontal direction substantially sweeping across the workpiece 32. As the plasma 45 combines with the feedstock gas 40, a discharging fluid 50 is generated which moves in the same horizontal direction the feedstock gas 40 to sweep over the workpiece 32 horizontally. This change of direction of the plasma 45 suppresses plasma damage to this workpiece 32. Additionally, directing the plasma 45 within the discharging fluid 50 enlarges the area of discharge on the surface of the workpiece 32, in effect, providing a larger ablation or cleaning area. Advantageously, due to larger ablation area, ablation or plasma damage is low and the rate of cleaning becomes higher. Thus, by changing the direction of the plasma 45 by the feedstock gas 40, direct vertical bombardment is prevented. Advantageously, when the feedstock gas 40 is an inert gas, it prevents oxidation and nitridation of the workpiece 32 caused by presence of ambient air in the cleaning chamber 34. In the above embodiments, an electric field is applied between the electrode 36 and the workpiece 32 when the workpiece 32 is an electrically conducting material. When the workpiece is electrically non-conducting, another electrically conducting member (not shown in the figures) within the cleaning chamber 34 is used to generate the electric field so that the plasma 45 is swept over the workpiece, as shown in FIGS. 4A and 4B. The feedstock gas 10 can also include nitrogen, hydrogen, compressed air, liquid carbon dioxide or liquid nitrogen, and combinations of these gases.

Figure 4C:
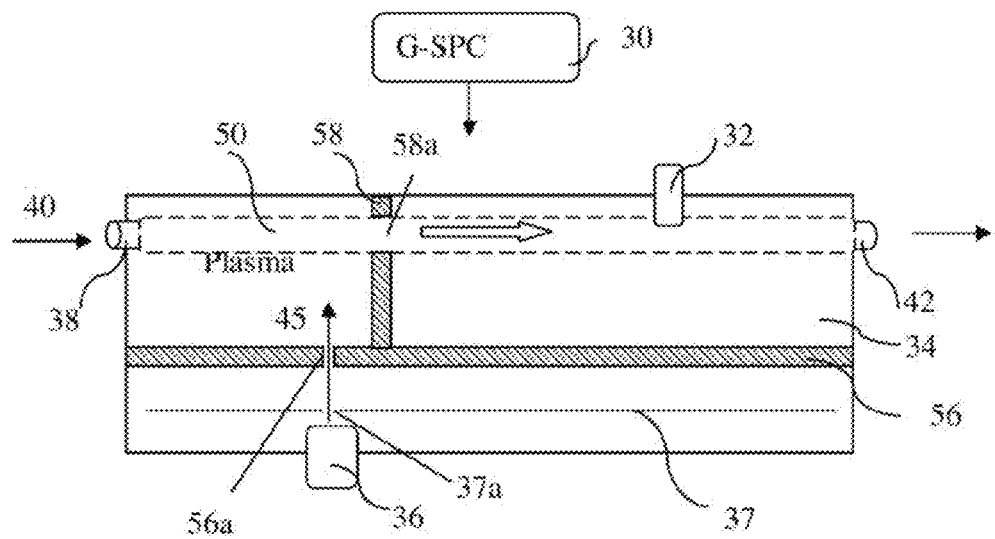

In FIG. 4A, a dielectric member 37 with an aperture 37a is located adjacent to the electrode 36. The concentrated electric field at the aperture 37a causes the air and gas to break down and form the plasma 45 containing a mixture of electrons, ions, radicals and neutral species. The plasma 45 is attracted to the workpiece in a horizontal sweeping manner. In FIG. 4B, the plasma 45 combines with the feedstock gas 40 to form the discharging fluid 50 over the workpiece 32. FIG. 4C shows another embodiment of the G-SPC cleaning chamber with an addition of a plasma guiding and amplification component 52. An embodiment of the plasma guiding and amplification component 52 is shown by two dielectric members 56, 58 arranged substantially perpendicular to each other. Each dielectric has an aperture. As seen in FIG. 4C, aperture 56a on the dielectric member 56 guides the plasma 45, whilst aperture 58a on the dielectric member 58 guides, shapes and directs the discharging fluid 50 to flow over surface of the workpiece 32. The effects of the dielectric members 56, 58 will be apparent when they are described again with FIG. 6.

Figures 5A, 5B:
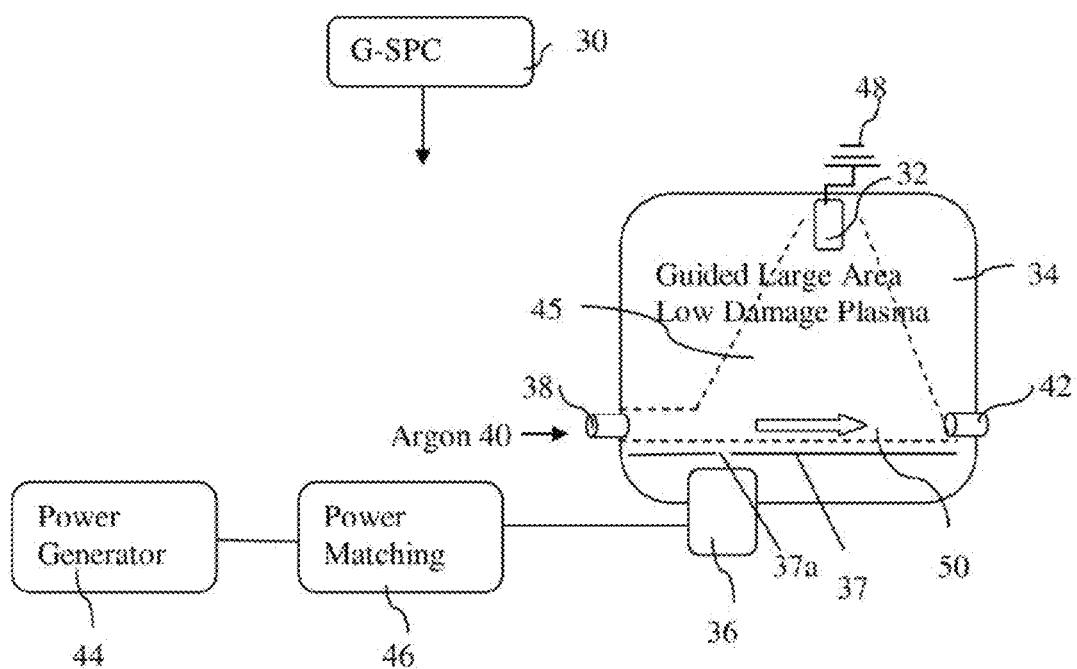
FIG. 5A showing some of the test parameters using the G-SPC system shown in FIG. 5B.

FIG. 5A shows a typical set of process parameters for the G-SPC embodiment shown in FIG. 5B. As shown in FIG. 5B, the output of a power generator 44 is fed to a power matcher unit 46 and then subsequently applied to the electrode 36. The power matcher unit 46 is made up of capacitors, resistors and inductors so that the impedance between the electrode 36 and the power generator 44 is matched for maximum power transfer. In addition, the impedance can be tuned to control the output current and voltage for the plasma discharge. In this embodiment the electric field is applied between the electrode 36 and the workpiece 32, for example, with the workpiece 32 being connected to the ground 48. Argon gas as the feedstock gas 40 is passed into the cleaning chamber 34 through the inlet 38, and the outlet 42 is provided a distance away from the inlet 38. The plasma 45 is formed between the electrode 36 and the workpiece 32 and spreads to some extent laterally along the flow of the feedstock gas 40 to form the discharging fluid 50 that covers the work-piece 32; as can be seen the plasma cleaning covers an enlarged area.

Figure 6:
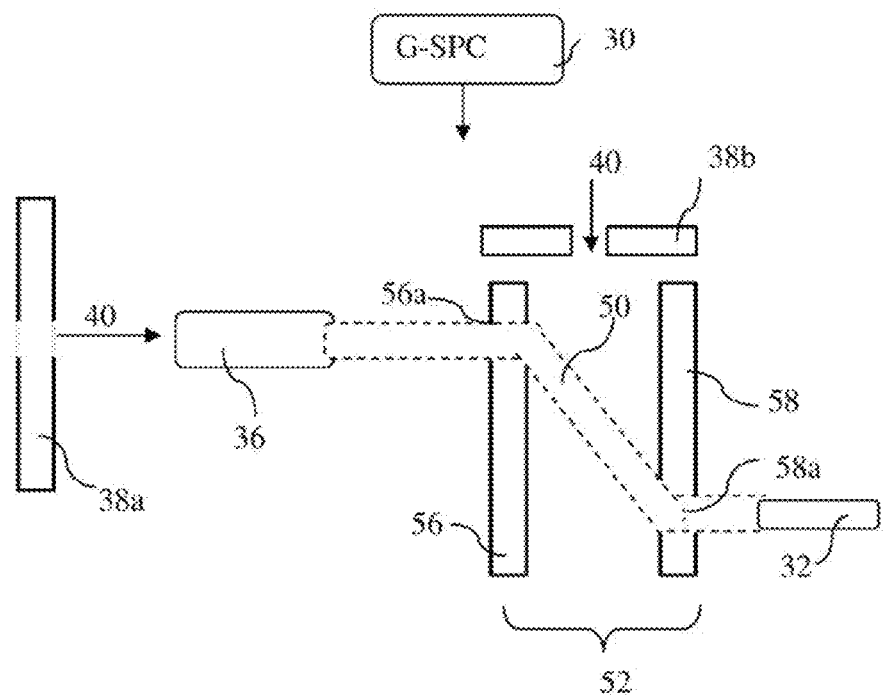
FIG. 6 is a schematic of a plasma alignment and amplification component for guiding the plasma in the G-SPC system.

In the plasma, electric flux density=electric field strength× permittivity. Dielectrics have high permittivity whilst the ambient gas or feedstock gas 40 has much lower permittivity. In another embodiment as shown in FIG. 6 the dielectric members 56, confirmed as the plasma alignment and amplification component 52 are arranged as two substantially parallel dielectric plates 56, 58. It is possible that the dielectric 56, 58 are formed as tubes. As seen in FIG. 6, the dielectric member 56 is near to the electrode 36 and there is no need for the dielectric member 37. As seen in FIG. 6, the plasma 45 created in the applied electric field merges with the feedstock gas 40 to form the discharging fluid 50. The discharging fluid 50 is then passed through apertures 56a, 58a in the dielectric plates 56, 58. The electric field strength within the apertures 58a is high and it shapes the discharging fluid 50. For example, by using suitable sizes and shapes of the apertures 56a, 58a, the plasma 45 in the discharging fluid is concentrated or expanded in area. With multiple dielectrics plates or tubes 56, 58 being stacked together and coupled with the discharging fluid 50, the plasma 45 is guided to flow in different directions (ie. in-directly) from the electrode to the work pieces 32. The dielectric members 56, 58 with small apertures 56a, 58a allow the plasma 45 and the discharging fluid 50 to pass through. Thus the ion energy, density of the plasma 45 and the discharging fluid 50 are accordingly controlled. As seen earlier, the dielectric members 56, 58 also assist in guiding or directing the plasma 45 so that the discharging fluid 50 covers the workpiece 32 surface including the workpiece surface inside the cleaning chamber 34.

Figure 7A:
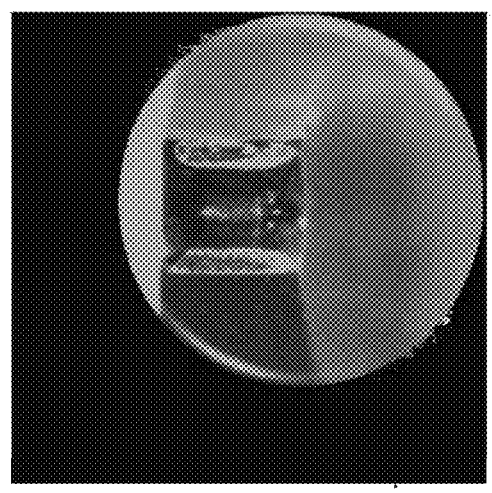
FIG. 7A is an enlarged view of a wire bonder's wedge.
Figure 7B:
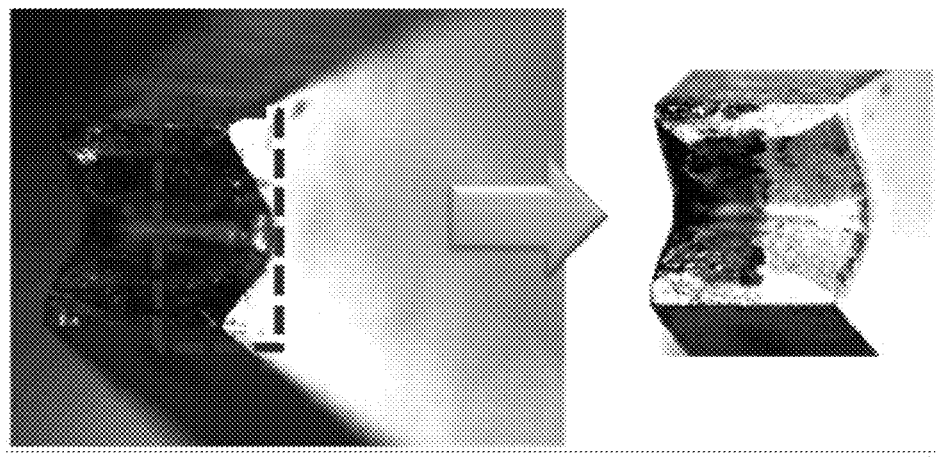
FIG. 7B is a scanning electron microscope (SEM) image of the wire bonder's wedge at FIG. 7A, before plasma cleaning.
Figure 7C:
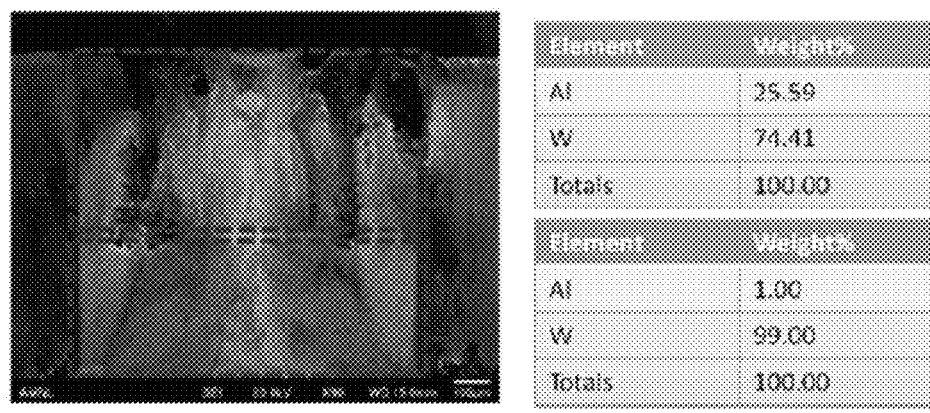
FIG. 7C shows SEM image of the wedge before and after plasma cleaning, together with contaminant signatures.

An enlarged photographic view of a wire bonder's wedge is illustrated in FIG. 7A. FIG. 7B is a scanning electron microscope (SEM) image of the edge that is contaminated with usage. FIG. 7C shows SEM images of the same wedge before after cleaning by the SPC, together with contaminant signatures.

Figure 8A:
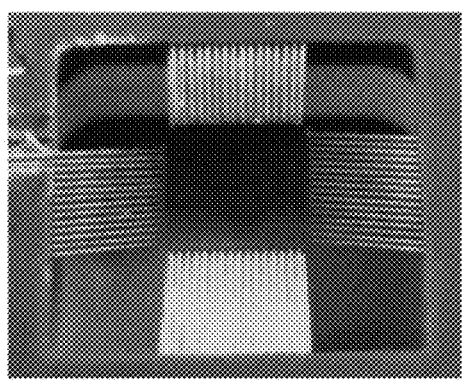
FIG. 8A is an enlarged view of a probe card.
Figure 8B:
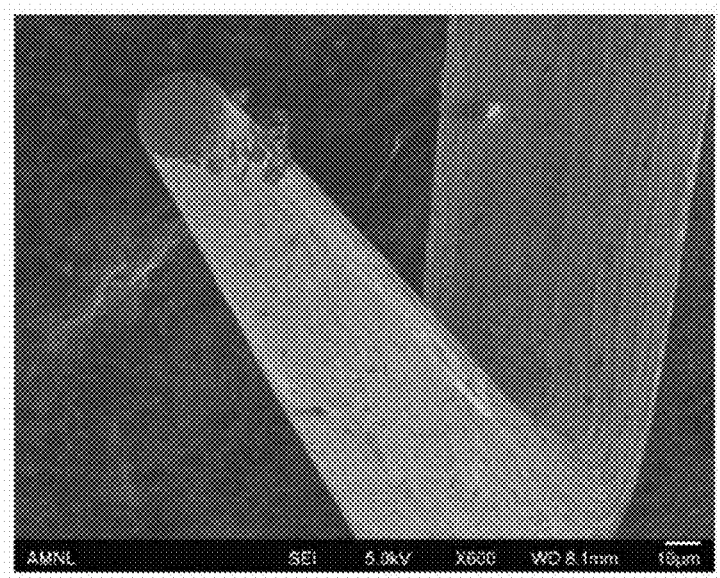
FIG. 8B is an SEM image of a probe tip before plasma cleaning.
Figure 8C:
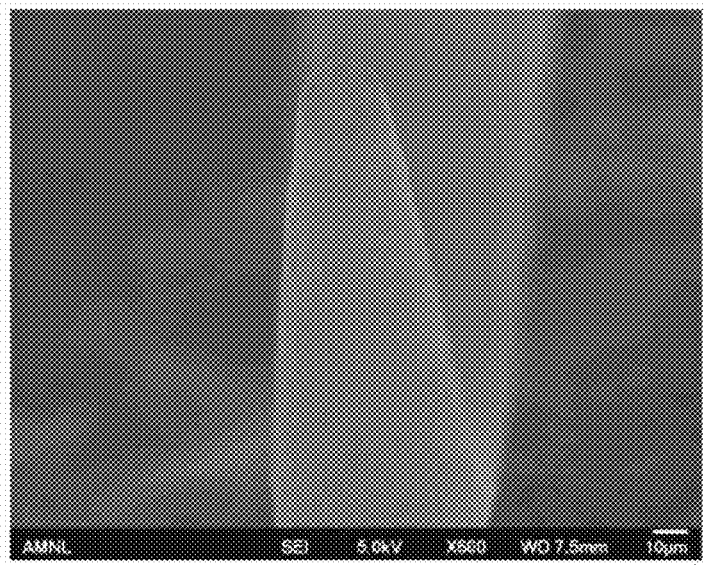
FIG. 8C is an SEM image of the probe tip at FIG. 8B, after plasma cleaning by G-SPC.

An enlarged photograph view of probe-card tips is illustrated in FIG. 8A. FIG. 8B is an SEM image of one of the probes that is contaminated with usage. FIG. 8C is an SEM image of the same probe cleaning by the SPC 30, 130.

Figure 9A:
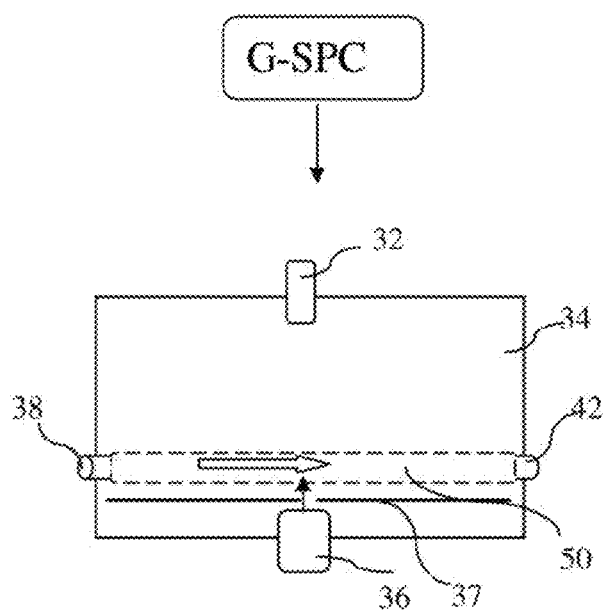
FIGS. 9A-9C are schematics of three different embodiments of the present invention using a single feedstock gas inlet G-SPC.
Figure 9B:
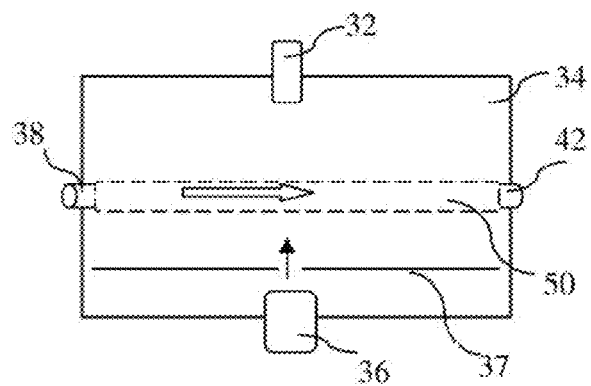
Figure 9C:
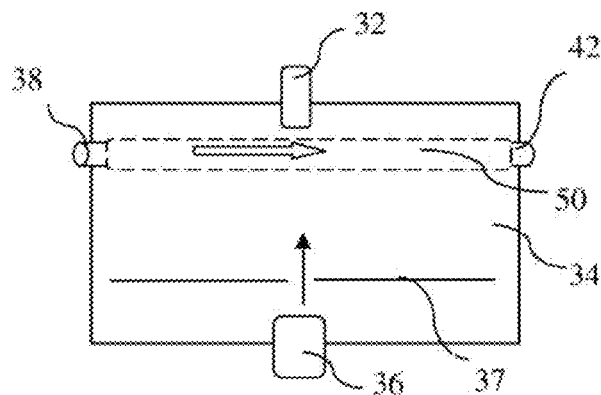

Several embodiments are illustrated at FIGS. 9A-9C for G-SPC with a single feedstock gas inlet 38. FIG. 9A shows the feedstock gas inlet 38 and outlet 42 at the same horizontal level and closer to the electrode 36 while being further away from the workpiece 32. FIG. 9B shows the feedstock gas inlet 38 and outlet 42 at the same horizontal level and centrally located between the electrode and the workpiece 32. FIG. 9C shows the feedstock gas inlet 38 and outlet 42 at the same horizontal level and closer to the workpiece 32 while being further away from the electrode 36.

Figure 10A:
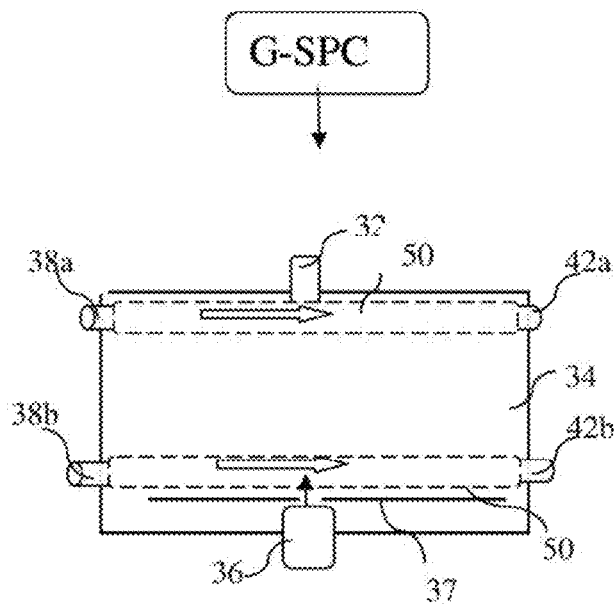
FIGS. 10A-10C are schematics of three different embodiments of the present invention using multiple feedstock gas inlets G-SPC.
Figure 10B:
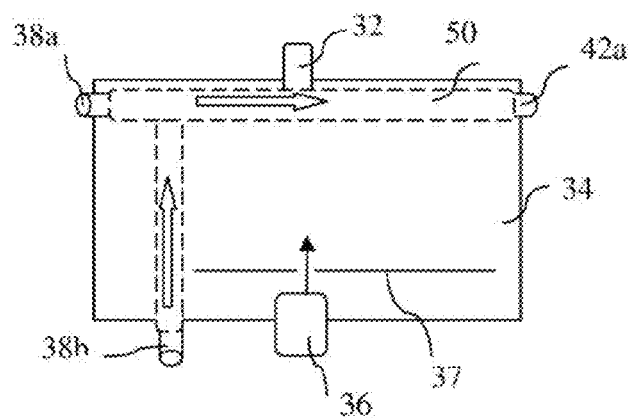
Figure 10C:
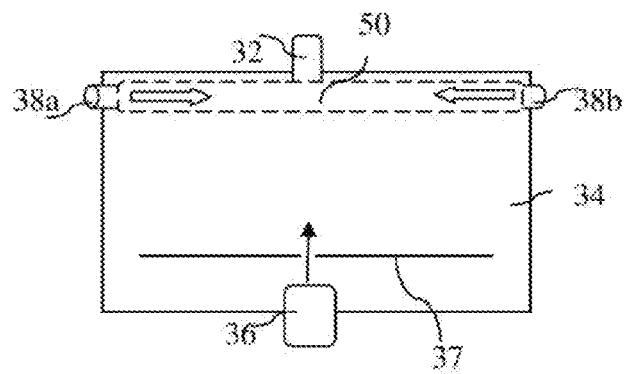

Several embodiments are illustrated at FIGS. 10A-10C for G-SPC with multiple feedstock gas inlets 38. FIG. 10A shows one set of the feedstock gas inlet 38b and outlet 42b at the same horizontal level and closer to the electrode 36 while another such set 38a, 42a respectively closer to the work piece 32. FIG. 10B shows one set of feedstock gas inlet 38a and outlet 42a at the same horizontal level and closer to the work piece 32; another feedstock gas 40 from the gas inlet 38b is vertically directed towards the previous set. FIG. 10C shows two feedstock gas inlets 38a, 38b at the same horizontal level and closer to the work piece 32. The flows of the discharge fluid 50 in these figures are represented by block arrows.

The present invention requires the use of the feedstock gas 40 that is brought in different directions (depending on applications) near to the electrode 36. Electric power in DC, AC, RF, pulsed mode and so on, from the power generator 44 causes the electrode to produce the plasma 45. The plasma 45 merges with the feedstock gas 40 within a recombination length to form the discharging fluid 50. The recombination length depends on the speed, pressure, volume, type and direction of flow of the feedstock fluid 40. In one embodiment, the discharging fluid 50 guides the plasma 45 to the surfaces of the work piece 32 for cleaning. The path of the plasma 45 thus shifts according to the direction of the feedstock gas 40. The change of direction of the path of the plasma 45 suppresses plasma damage at the surface of the work pieces 32 to different extents depending on the paths of the feedstock gas 40 within the cleaning chamber 34.

In addition, the plasma alignment and amplification component 52 is designed to align and guide the beam of the plasma 45; in effect, the plasma alignment and amplification component enhances the guiding by the feedstock gas 40, widens the plasma ablation area and also lowers down the power required to discharge the feedstock gas 40. The plasma alignment and amplification component 52 also helps to reduce surface damage during plasma cleaning.

Figures 11, 12A:
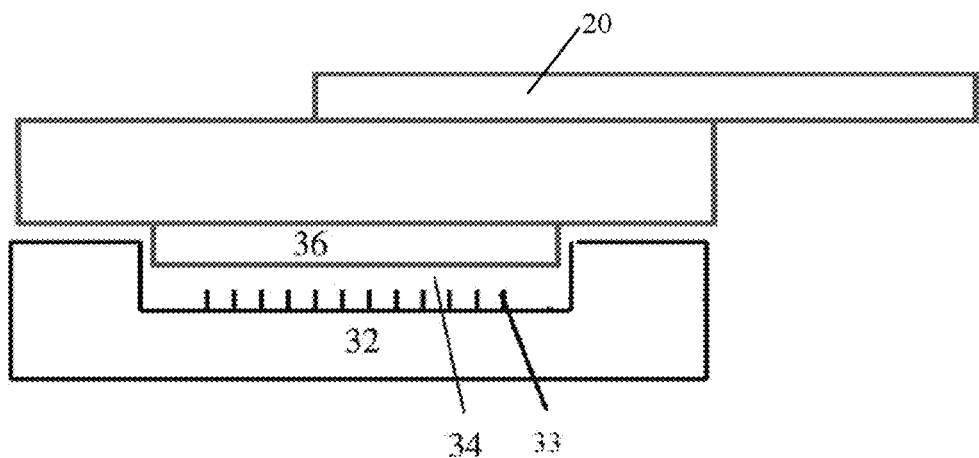
FIG. 11 is a table showing the thermal expansion coefficients of known elements.
FIG. 12A is a schematic of the above SPC system configured into a cavity of a Kelvin test socket.

The cleaning mechanism is induced by the plasma species brought by the discharging fluid 50. Agitating electrons, ions and radicals penetrate the cracks and recesses of the workpiece surface and transfer oscillating forces to the contaminants that adhere tightly onto the surface. A portion of the energy is transferred from the discharging fluid 50 to the surface of work pieces 32 causing a rise in temperature (less than 65 degC. or 65-100 degC.). The localized heating causes thermal expansion of the materials on the surface. Contaminants having thermal expansion coefficients that are different from that of the workpiece 32 become detached from the surface under the influence of the oscillation forces. FIG. 11 shows known values of thermal expansion coefficients of several elements for reference.

Ions, radicals and neutral species at the electrode 36 including the same elements of the workpiece 32 are also transferred onto the surface of workpiece 32 to replace the contaminants. This reconditions the surface and recovers the structure distortion caused by the removal of embedded contaminants. The localized healing will also anneal the surface in-situ and repair the internal structure of the workpiece 32 as discussed earlier.

Figure 12B:
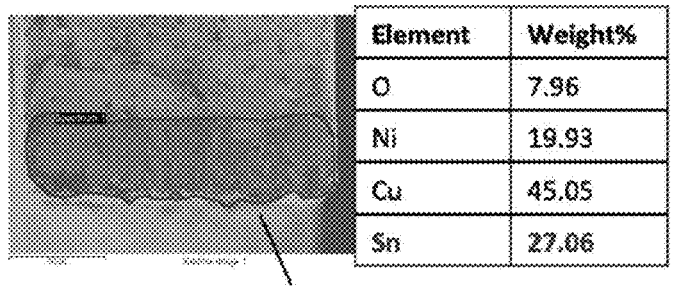
FIG. 12B is an SEM image of a Kelvin test socket's pin before cleaning together with contaminant signatures, whilst
Figure 12C:
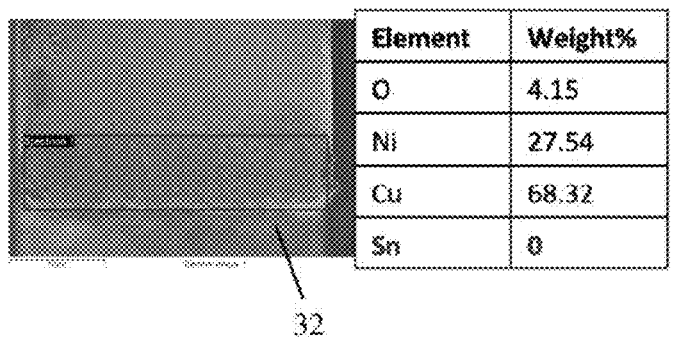
FIG. 12C is an SEM image of the Kelvin test socket pin after SPC.
Figure 12D:
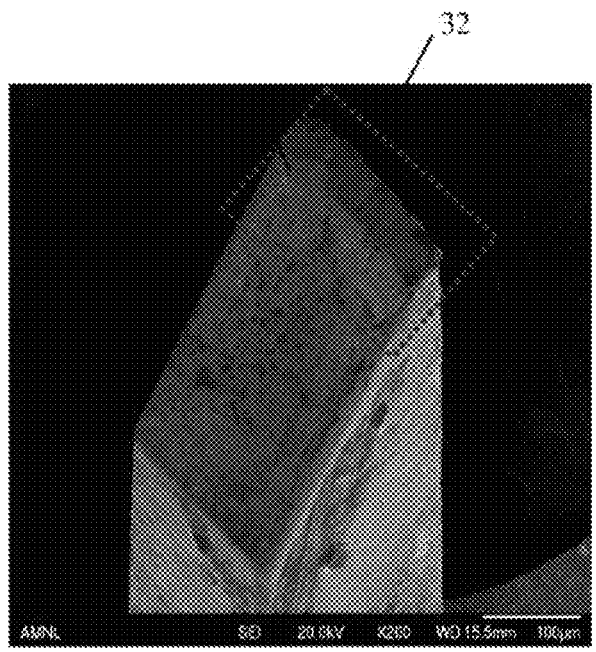
FIGS. 12D and 12E are also SEM images of the Kelvin test socket pin before and after SPC.
Figure 12E:
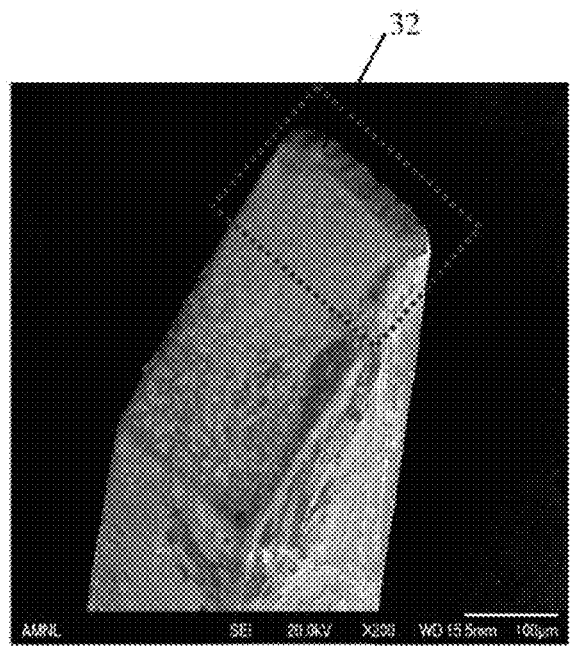

Advantageously, the SPC cleaning apparatus is small. FIG. 12A shows the electrode 36 of the SPC is mounted onto a handler 20 and the electrode 36 is configured to be inserted into a cavity of a test socket 32 for semiconductor testing, the space at the socket cavity between the test socket 32 and electrode 36 thus forms a cleaning chamber 34. In FIG. 12A, the feedstock 40 gas inlet and suction line for removing contaminants are not shown. FIG. 12B shows an SEM image of a pin 33 in the Kelvin test socket before SPC, together with an analysis of the surface contamination. FIG. 12C shows an SEM image of the Kelvin test socket pin after SPC, together with an analysis of the surface contamination. FIG. 12C shows that the SPC system has been effective in removing tin contamination or pins in a test socket. FIGS. 12D and 12E are also SEM images of the Kelvin pin before and after SPC.

Figure 13A:
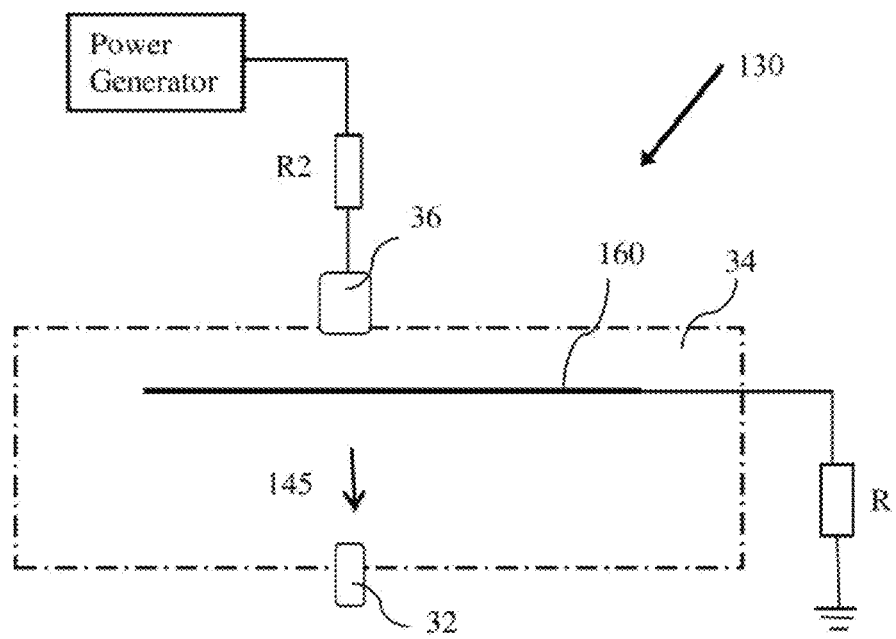
FIG. 13A is a schematic of a SPC system with a floating electrode according to another embodiment.

FIG. 13A shows a schematic of a SPC system 130 according to another embodiment of the present invention. As shown in FIG. 13A, the SPC system 130 includes a cleaning chamber 34, an electrode 36 connected to a power generator 44, a floating electrode 160 disposed between the electrode 36 and the workpiece 32 to generate a plasma 145. The floating electrode 160 is electrically isolated and has a floating potential relative to the power generator 44; schematically, a network R (made up of resistor, inductor and capacitor) is shown connected to ground or a bias. In use, the plasma 145 generated between the floating electrode 160 and the workpiece 32 inside the cleaning chamber 34 has low ion energy. As in the above embodiments, the cleaning chamber is at atmospheric pressure. The plasma 145 is different from that in the NTP shown in FIG. 3 and has low ion bombardment energies and plasma damage to the workpiece is suppressed. In the space between the electrode 36 and the floating electrode 160, there may or may not any plasma present. In one embodiment, the floating electrode 160 is made from a metal; in another embodiment, the floating electrode 160 is made of ceramic, semiconductor or electric insulator. When the floating electrode is metallic, it can be connected to ground or tuning to a bias via the network R of resistor, inductor and capacitor; in this way, the electric field and ion energy in the cleaning chamber can be controlled. Large area uniformity in plasma discharge is achieved by charge compensation via the floating electrodes and tuning the network R of resistor, inductor and capacitor.

Figure 13B:
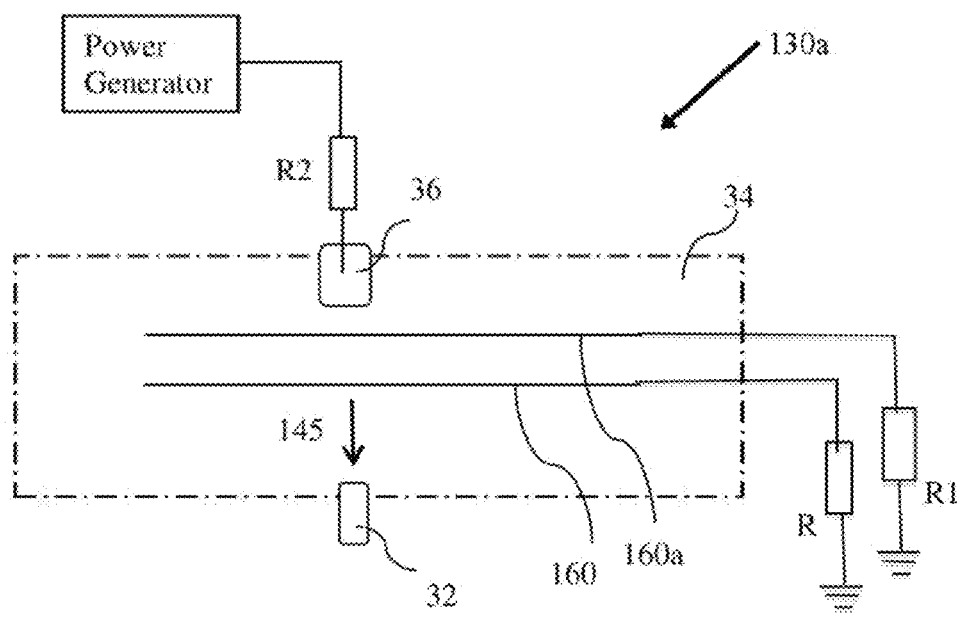
FIG. 13B is a schematic of a SPC system with two floating electrodes.
Figure 13C:
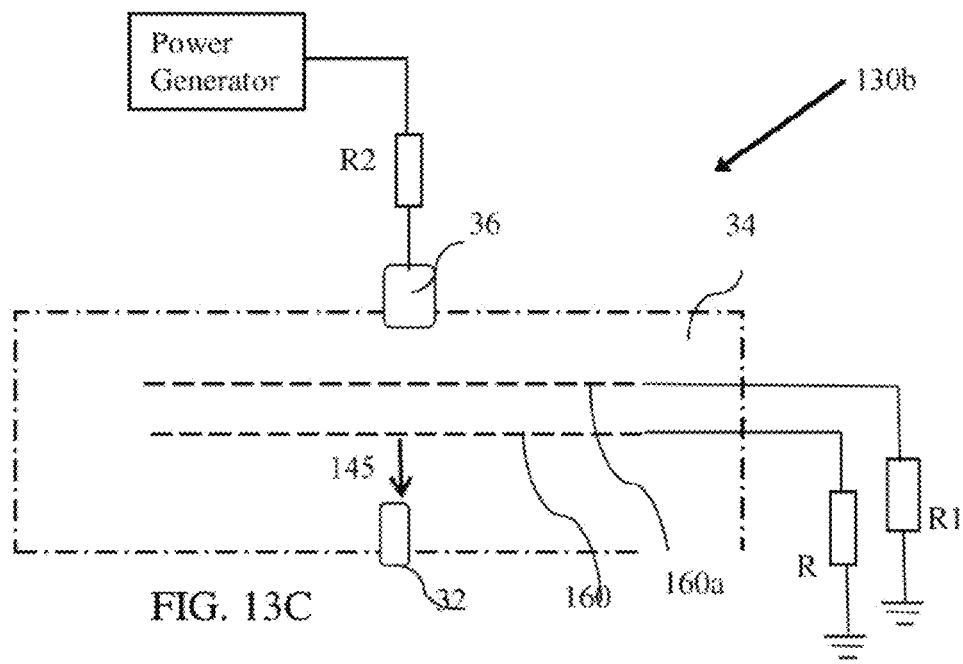
FIG. 13C is a schematic of a SPC system with grid floating electrodes.

FIG. 13B shows a variation of the SPC system. This SPC system 130a is similar to the above except that there are two floating electrodes 160, 160a. These floating electrodes 160, 160a are thin flat plates; in another embodiment of the SPC system 130b, as shown in FIG. 13C, the floating electrodes 160, 160a are grid meshes or plates with perforations, which are advantageous for use with a feedstock gas 40.

Figure 14A:
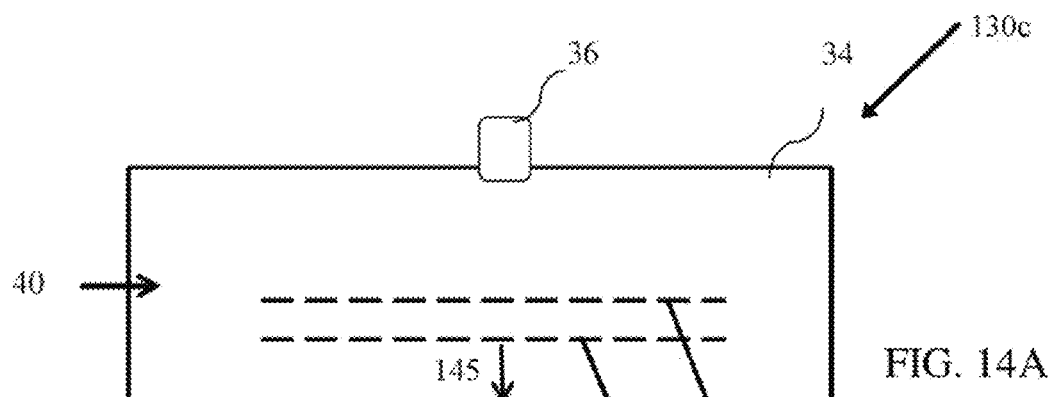
FIG. 14A is a schematic of the SPC system shown in FIG. 13 by using a gas flow, whilst

The above SPC system 130, 130a-130b is suitable for localized plasma cleaning on the workpiece 32 has a small cross-sectional area, such as a pin or probe. Advantageously, the surround area near a tip of the pin or probe is also cleaned during SPC. For large area plasma cleaning, a feedstock gas 40 is supplied into the cleaning chamber 34, as shown by a SPC system 130c in FIG. 14A. The feedstock gas 40 provides ions and inert gas radicals to enhance the plasma cleaning process and to spread plasma cleaning over a large surface of the workpiece 32. It is possible that there are two or more feedstock gases 40 are fed into the cleaning chamber 34. As in the above embodiments, the feedstock gas can be a single element or a mixture of gases.

Figure 14B:
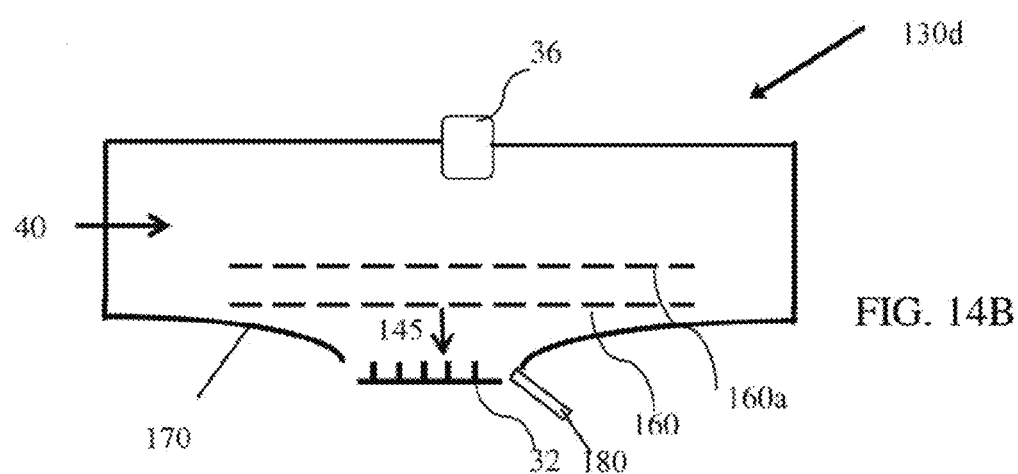
FIG. 14B shows another embodiment with guided discharging gas flow.

FIG. 14B stows a SPC system 130d according to another embodiment. This SPC system 130d is similar to the above SPC system 130e except that the plasma 145 is now guided by deflectors 170 onto the workpiece 32. To remove contaminants dislodged from the workpiece, a suction nozzle 180 is provided near the workpiece.

Figure 15:
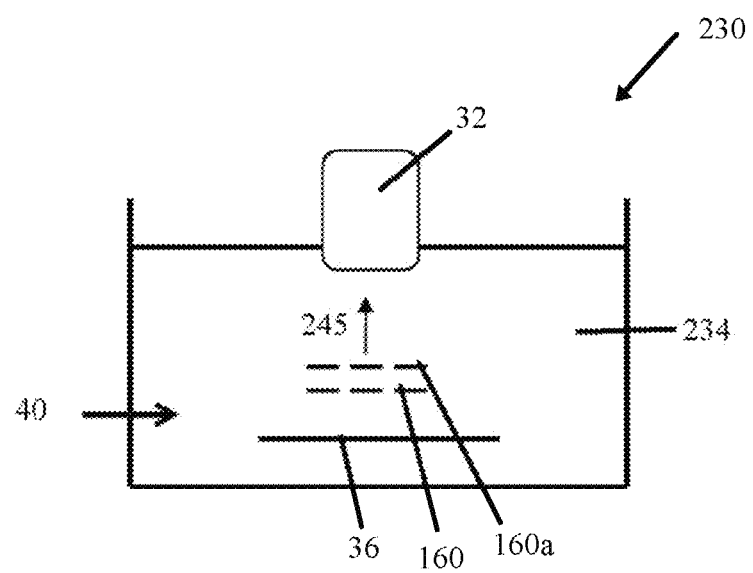
FIG. 15 is a schematic of a SPC system configured with the cleaning chamber containing a liquid medium according to yet another embodiment.

The above SPC systems 30, 130, 130a-130d are applied in a dry cleaning chamber 34. FIG. 15 shows a SPC system 230 being configured with the cleaning chamber containing a liquid medium 234, where external connections to the floating electrodes 160, 160a and electrodes are not shown in the figure. As shown in FIG. 15, floating electrodes 160, 160a are immersed inside the liquid medium 234 between the electrode 36 and workpiece 32. The cleaning chamber is filled with a liquid medium, such as, water. In an embodiment, salt ions, such as potassium or sodium ions, are added into the liquid medium by dissolving in it a salt. An advantage of this embodiment is the plasma cleaning process uses both salt ions and water bombardments; this is effective in cleaning deep recesses, such as the recesses on wedges in wire bonders. In another embodiment, a salt solution is injected into the liquid medium 234. In yet another embodiment, a feedstock gas 40 is alternatively or additionally injected into the liquid medium during SPC. Other liquids, such as a solvent or chemical solution can also be used.

While specific embodiments have been described and illustrated, it is understood that many changes, modifications, variations and combinations thereof could be made to the present invention without departing from the scope of the invention. For example, the discharging fluid 50 can pass through an outlet and be directed via a tube to a nozzle or a cleaning gun to remotely clean a workpiece. In another example, the power supply can be driven in other modes, such as, in a RF mode. In another embodiment, depending on the design of the cleaning chamber, the pressure in the chamber is increased to about 5 bar or evacuated by a vacuum pump so long as there is a differential pressure for the feedstock gas 40 to enter the cleaning chamber 34 without affecting the non-thermal plasma cleaning principles of the present invention.

The invention claimed is:

1. A non-thermal soft plasma cleaning system comprising:
a cleaning chamber containing a fluid at atmospheric pressure;
an electrode and a workpiece disposed in the cleaning chamber,
a power generator is connected to the electrode; and
a dielectric member is disposed between the electrode and the workpiece, with the dielectric having an aperture, such that the aperture is configured relative to both the electrode and the workpiece, so that a plasma generated between the electrode and the workpiece goes through the aperture and is guided or directed to clean the workpiece in a sweeping direction;
wherein the workpiece is cleaned by the plasma without causing plasma damage on the workpiece.

2. The non-thermal soft plasma cleaning system according to claim 1,
further comprising a feedstock gas which is injected into the cleaning chamber, wherein the feedstock gas adds plasma species and the feedstock gas combines with the plasma to form a discharging fluid flow, so that the discharging fluid flow guides the plasma to the workpiece and expands a cleaning area on the workpiece; and
wherein the fluid in the cleaning chamber is air or a gas.

3. The non-thermal soft plasma cleaning system according to claim 2, further comprising a second dielectric member with an aperture, with the second dielectric member being disposed substantially perpendicular to the (first) dielectric member to constitute a plasma guiding and amplifying component.

4. The non-thermal soft plasma cleaning system according to claim 2, further comprising a second dielectric member with a second aperture, with the second dielectric member being disposed substantially parallel to the (first) dielectric member such that the (first) aperture is not in line with the second aperture, so as to constitute a plasma guiding and amplifying component.

5. The non-thermal soft plasma cleaning system according to claim 2, further comprising a floating electrode disposed in the cleaning chamber, wherein the floating electrode is connected to a tuning network of resistor, inductor and capacitor, with the tuning network connected to ground or a bias to provide further control over both an electric field component and ion energy in the plasma.

6. The non-thermal soft plasma cleaning system according to claim 5 comprising two or more floating electrodes.

7. The non-thermal soft plasma cleaning system according to claim 5, wherein the floating electrode is configured as a plate, a plate with perforations or a grid mesh.

8. The non-thermal soft plasma cleaning system according to claim 5, further comprising a deflector to preionise, guide or direct the plasma in the cleaning chamber to the workpiece.

9. The non-thermal soft plasma cleaning system according to claim 2, wherein the feedstock gas is an inert gas, nitrogen, hydrogen, compressed air, liquid carbon dioxide or liquid nitrogen, or any combination thereof.

10. The non-thermal soft plasma cleaning system according to claim 1, wherein the workpiece is configured as a test socket and a cavity of the test socket forms the cleaning chamber.

11. The non-thermal soft plasma cleaning system according to claim 1, wherein the workpiece is configured as a wire bonder wedge, a pin of a probe card for testing semiconductor devices, a pin of a test socket for testing semiconductor devices or other devices susceptible to plasma ion damage.

12. The non-thermal soft plasma cleaning system according to claim 1, wherein the fluid contained in the cleaning chamber is a liquid.

13. The non-thermal soft plasma cleaning system according to claim 12, wherein the liquid is water, solvent or a chemical solution.

14. The non-thermal soft plasma cleaning system according to claim 13, further comprising salt ions dissolved in the water.

15. The non-thermal soft plasma cleaning system according to claim 12, further comprising an inlet for injecting water or solvent with salt ions or a chemical solution into the cleaning chamber.

16. The non-thermal soft plasma cleaning system according to claim 15, further comprising an inlet for injecting a feedstock gas into the cleaning chamber.

17. The non-thermal soft plasma cleaning system according to claim 12, further comprising a floating electrode disposed between the electrode and the workpiece, with the floating electrode being connected to a tuning network of resistor, inductor and capacitor to provide further control over both an electric field component and ion energy and the floating electrode is made of a metal, ceramic, a semiconductor or an electric insulator.

18. The non-thermal soft plasma cleaning system according to claim 17, wherein the floating electrode is configured as a plate, a plate with perforations or a grid mesh.

19. The non-thermal soft plasma cleaning system according to claim 1, further comprising a second dielectric member, which is disposed adjacent to the (first) dielectric member to further guide or direct the plasma to clean the workpiece in the sweeping direction.

* * * * *